United States Patent
Flint et al.

(10) Patent No.: US 11,496,219 B2
(45) Date of Patent: Nov. 8, 2022

(54) RADIO FREQUENCY MIXER IMPLEMENTED WITH A PHOTONIC CIRCUIT

(71) Applicant: Leonardo UK Ltd, London (GB)

(72) Inventors: Ian Flint, Basildon Esses (GB);
Taimur Mirza, Basildon (GB); Shyqyri Haxha, Basildon (GB)

(73) Assignee: ELONARDO UK LTD, London (GB)

( * ) Notice: Subject to any disclaimer, the term of this patent is extended or adjusted under 35 U.S.C. 154(b) by 0 days.

(21) Appl. No.: 17/423,232

(22) PCT Filed: Jan. 15, 2020

(86) PCT No.: PCT/EP2020/050916
§ 371 (c)(1),
(2) Date: Jul. 15, 2021

(87) PCT Pub. No.: WO2020/148337
PCT Pub. Date: Jul. 23, 2020

(65) Prior Publication Data
US 2022/0085888 A1    Mar. 17, 2022

(30) Foreign Application Priority Data
Jan. 15, 2019  (GB) .................................. 1900552

(51) Int. Cl.
*H04B 10/2575* (2013.01)
*H03D 7/00* (2006.01)
*H04B 10/50* (2013.01)

(52) U.S. Cl.
CPC ........... *H04B 10/2575* (2013.01); *H03D 7/00* (2013.01); *H04B 10/505* (2013.01); *H03D 2200/0066* (2013.01); *H04B 2210/006* (2013.01)

(58) Field of Classification Search
None
See application file for complete search history.

(56) References Cited

U.S. PATENT DOCUMENTS 7,522,842 B1 *  4/2009  McNicol ............ H04B 10/2916
                                                    398/160
7,877,020 B1     1/2011  Hayes et al.
(Continued)

FOREIGN PATENT DOCUMENTS

EP       3373482 A1     9/2018
JP     2008141559 A     6/2008

OTHER PUBLICATIONS

Great Britain Combined Search and Examination Report under Sections 17 and 18(3) dated Jun. 27, 2019 issued in Great Britain Application No. GB1900552.9 by the United Kingdom Intellectual Property Office. (5 pages).

(Continued)

*Primary Examiner* — Darren E Wolf
(74) *Attorney, Agent, or Firm* — Buchanan Ingersoll & Rooney PC

(57) ABSTRACT

A common method of down converting a received RF signal mixes the received RF signal with a LO signal to create a beat signal. Exemplary embodiments can address multiple simultaneously received RF signals which beat within receiver electronics at frequencies similar to that of the down converted signals. An RF mixer is disclosed using a photonic circuit arranged to impose the RF signal and the LO signal onto separate optical beams. An arrangement provides a beam carrying the RF signal to a first optical input of a balanced photodiode receiver and another beam carrying the RF and LO signals to a second optical input of the balanced photodiode receiver. Any beat products formed (Continued)

Figure 1:
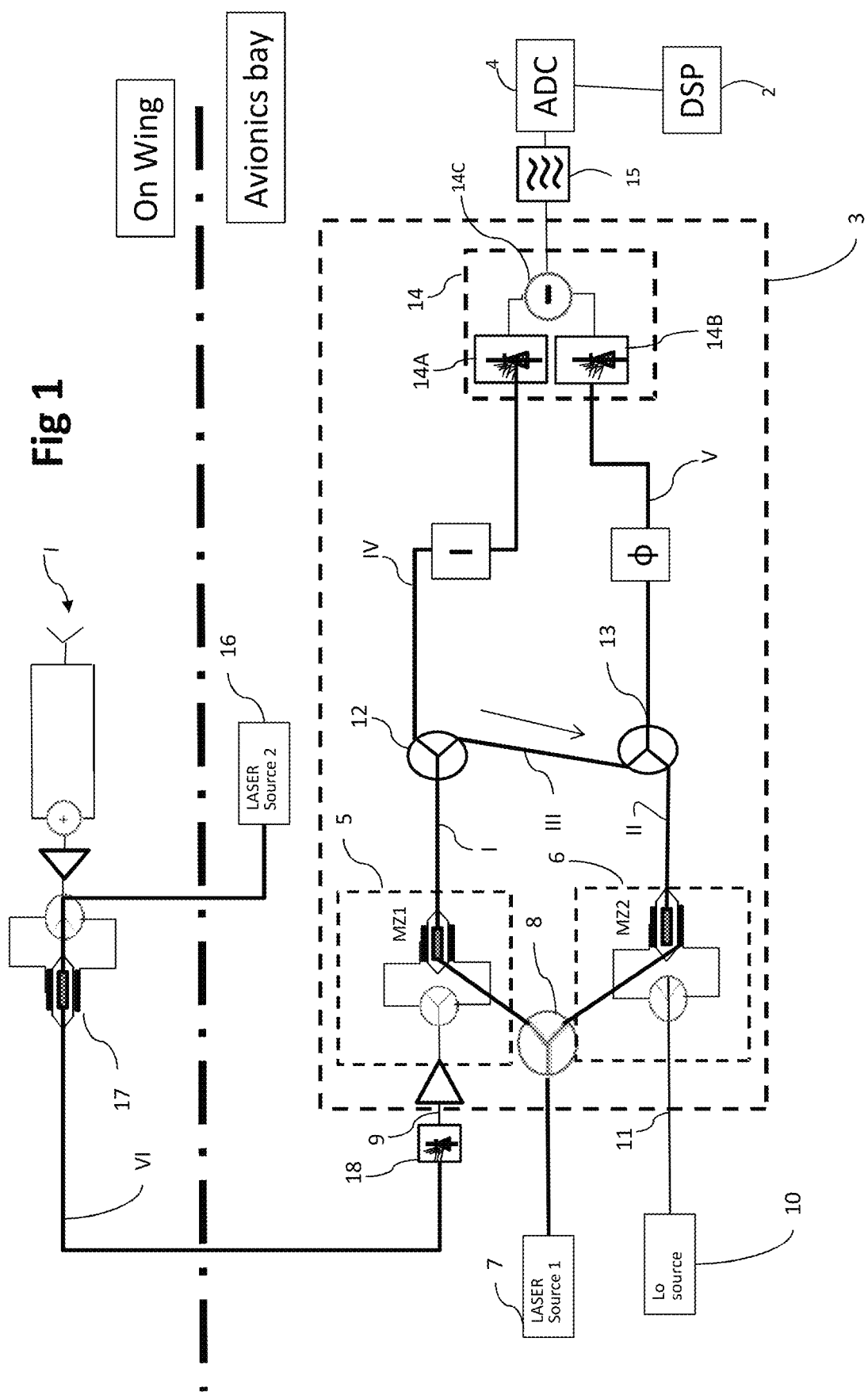

between different RF signals will be cancelled out at the electrical output of the balanced photodiode receiver.

20 Claims, 2 Drawing Sheets

(56) References Cited

U.S. PATENT DOCUMENTS

| | | | | |
|---|---|---|---|---|
| 8,842,992 B2* | 9/2014 | Middleton | ............. | H04B 10/00 398/208 |
| 2003/0175037 A1* | 9/2003 | Kimmitt | ............. | H04B 10/516 398/198 |
| 2011/0097085 A1* | 4/2011 | Oda | ............. | H04B 10/516 398/65 |
| 2012/0069854 A1* | 3/2012 | Suzuki | ............. | H04J 14/06 370/465 |
| 2015/0002920 A1 | 1/2015 | Shi | | |
| 2018/0102849 A1* | 4/2018 | Morton | ............. | G02B 27/00 |

OTHER PUBLICATIONS

International Search Report (PCT/ISA/210) and Written Opinion (PCT/ISA/237) dated Apr. 22, 2020, by the European Patent Office as the International Searching Authority for International Application No. PCT/EP2020/050916. (11 pages).

Ridgway, Richard W., et al., "Microwave Photonics Programs at DARPA", Journal of Lightwave Technology, Oct. 15, 2014, pp. 3428-3439, vol. 32, No. 20, XP011557754, ISSN:0733-8724, DOI:10.1109/JLT.2014.2326395, IEEE, USA.

Office Action (Examination Report No. 1) dated May 5, 2022, by the Australian Patent Office in corresponding Australian Patent Application No. 2020209977. (3 pages).

First Office Action dated Aug. 30, 2022, by the Japanese Patent Office in corresponding Japanese Patent Application No. 2021-541101, and an English Translation of the Office Action. (6 pages).

* cited by examiner

RADIO FREQUENCY MIXER IMPLEMENTED WITH A PHOTONIC CIRCUIT

The present invention relates in one aspect to a RF mixer implemented with a photonic circuit and in another to a Radio-on-Fibre Link comprising a RF mixer for the purpose of up converting or down converting a RF signal carried by the fibre link.

Microwave RF receivers typically include means to down convert a received signal so that the received signal can be processed by an analogue to digital converter (ADC). Microwave RF transmitters similarly often comprise an up converter to up convert the output of the digital analogue converter (DAC) to the desired transmission frequency. Up converting and down converting is achieved by mixing the signal to be converted with a LO signal. The mixed signals interfere forming a beat which occurs at a frequency between the two mixed signals. By selecting the frequency of the LO signal, the frequency of the beat can be caused to fall within a desired frequency range that, in the case of a receiver, can be processed by the ADC.

In environments that are dense with microwave RF signals of different frequencies, it is common for two or more simultaneously received signals to beat within the receiver electronics. Beating between these received signals can occur at frequencies falling within the same range as down converted signals and thus it can be difficult to distinguish between the two. This problem is acute in the application of electronic warfare (EW) receivers which need to receive signals across a very wide band of frequencies and where the precise frequency of signals of interest may not be known beforehand.

The present invention was conceived to remedy this problem.

According to a first aspect of the invention there is provided a radio frequency (RF) mixer comprising: a first photonic modulator adapted to impose RF signals received through an input of the RF mixer onto a first optical beam; a second photonic modulator adapted to impose a LO signal from a LO signal source onto a second optical beam; an optical splitter arranged to split the first optical beam outputted from the first photonic modulator to provide a third optical beam and a fourth optical beam; an optical combiner adapted to combine the third optical beam with the second optical beam; a balanced photo detector circuit arranged to provide an electrical signal output corresponding to a difference between the electrical responses of:

a first photodetector arranged to receive the combined third optical beam, and second optical beam, and a second photodetector arranged to receive the fourth optical beam.

Because the unwanted beat frequencies derived from interference between received RF signals will be present on both inputs to the balanced photodetector circuit they will be substantially eliminated by the balanced photo detector circuit and thus absent from its output, whereas the beat frequencies derived from interference between the LO signal and received RF signals, which are only present at one input to the balanced photodetector circuitry will be present in the photodetector circuit's output.

Where implemented in a receiver system, this allows for undesired beating to be removed from the received signal before being passed to a digital signal processor. In the case of a transmitter system arranged to transmit two RF signals simultaneously, the invention similarly allows for removal of unwanted beat frequencies from the input to the antenna.

Furthermore, through this arrangement, in addition to providing the aforementioned function, the balanced photodetector can also provide its conventional function of balancing fluctuations in the optical power of the two beams received by the photodetector circuitry resulting from temporal changes in the output power of a single laser source from which the beams originate.

The RF mixer may comprise one or more intensity controllers arranged to alter the intensity of one or more of the: first, second, third and fourth optical beams, in order to substantially match the optical intensity of the combined second and third beam, and fourth beam at the electro-optic transducer.

The first photonic modulator may be a first Mach-Zehnder modulator. The second photonic modulator may be a second Mach-Zehnder modulator. The first and second Mach Zehnder modulators are favourably arranged in parallel, and may be formed on a single photonic monolith (chip).

The RF mixer may comprise a first light source (typically a laser) that emits coherent light with a first wavelength; and a further optical splitter arranged to split the light from the first light source to provide the first and second optical beams.

In the arrangement described above, the output of the balanced photodetector circuit will include the LO signal and/or harmonics thereof. It is preferable that the mixer comprises means to substantially remove the LO signal and harmonics thereof from this output before it is passed to the ADC.

This may be achieved by using the second photonic modulator to impose the LO signal onto a multiplexed optical beam comprising the second optical beam and a subsidiary optical beam of a different wavelength to the second optical beam. The subsidiary beam can then be separated from the second beam, favourably subsequent to the multiplexed beam being combined with the third beam and before the combined second and third beams are received by the balanced photodetector circuitry. A further photodetector may be used to receive the separated further optical beam and output an electrical signal representative of the LO signal which in turn forms a first input of subtractor circuitry e.g. implemented by a differential amplifier, the output of the balanced photodetector forming a second input of the subtractor circuitry. The subtractor circuitry is arranged to provide, at its output, an electrical signal corresponding to the difference between the signals received at its inputs. The output of the subtractor circuitry may form an input to the ADC.

The advantage of using the second photonic modulator to impose the LO signal onto a second beam, compared with using the LO signal straight from the LO signal source, is that the subtraction process carried out by the subtractor circuitry will remove distortion products derived from the second photonic modulator in addition to removing the LO signal.

The RF mixer may comprise a second light source (typically a laser) that provides the subsidiary optical beam of a wavelength that is different to the wavelength of the second optical beam, and a multiplexer that multiplexes the second optical beam with the subsidiary optical beam light.

The RF mixer may, in use, function as a down converter in a receiver system. Where so it may be arranged to receive an RF signal from an antenna, and have its output connected to an ADC arranged to digitise the down converted RF signals passed on from the RF mixer for processing by a digital signal processor.

In another aspect of the invention there is provided a radio on fibre link comprising the RF mixer as variously described above.

The photonic link may be arranged to transmit microwave RF signals from an antenna towards a digital processing system. As such the photonic link may be arranged to transfer signals from an antenna to an analogue digital converter.

The RF mixer may be remote from the antenna and the photonic link may comprise: a further photonic modulator arranged to impose the RF signals from the antenna onto a further optical beam; a fibre that extends substantially between the antenna and the RF mixer along which the further optical beam with imposed RF signals is carried; and a further photodetector arranged to receive the further optical beam and output an electrical signal corresponding to the RF signal imposed on the further optical beam, the output of the further photodetector being connected to the input of the RF mixer.

In one application the radio on fibre link may be used to transmit signals received by an antenna mounted on an aerial platform, such as a plane, to a digital processing system sited in an avionics bay of the aerial platform.

According to a further aspect of the invention there is provided a method of mixing radio frequencies for the purpose of up converting or down converting according to claim 12.

The method may comprise splitting an optical output from a first light source that emits light with a first wavelength to provide the first and second optical beams.

The method may comprise multiplexing the second optical beam with a subsidiary optical beam having a wavelength that is different from the second optical beam; imposing the LO signal onto the multiplexed second optical beam and subsidiary beam; combining the multiplexed second optical beam and subsidiary beam with the third optical beam; separating the subsidiary optical beam from the combined third optical beam and second optical beam before it reaches the first photodiode; using a third photo detector arranged to receive the separated subsidiary optical beam to output the LO signal that was imposed thereon; and using subtractor circuitry arranged to receive the electrical signal output from the first photo detector and the electrical signal output of the balanced photodetector to provide at an output of the subtractor circuitry, an electrical signal corresponding to the difference there between.

The method may comprise transmitting RF signals between the antenna and the RF mixer by imposing the RF signals onto a further optical beam with a further photonic modulator, transmitting the further optical beam on which the RF signals have been imposed over a fibre that extends substantially between the antenna and RF mixer, and using a further photodetector arranged to receive the further optical beam subsequent at a output of the fibre to provide an electrical signal corresponding to the RF signal imposed on the further optical beam.

Figure 2:
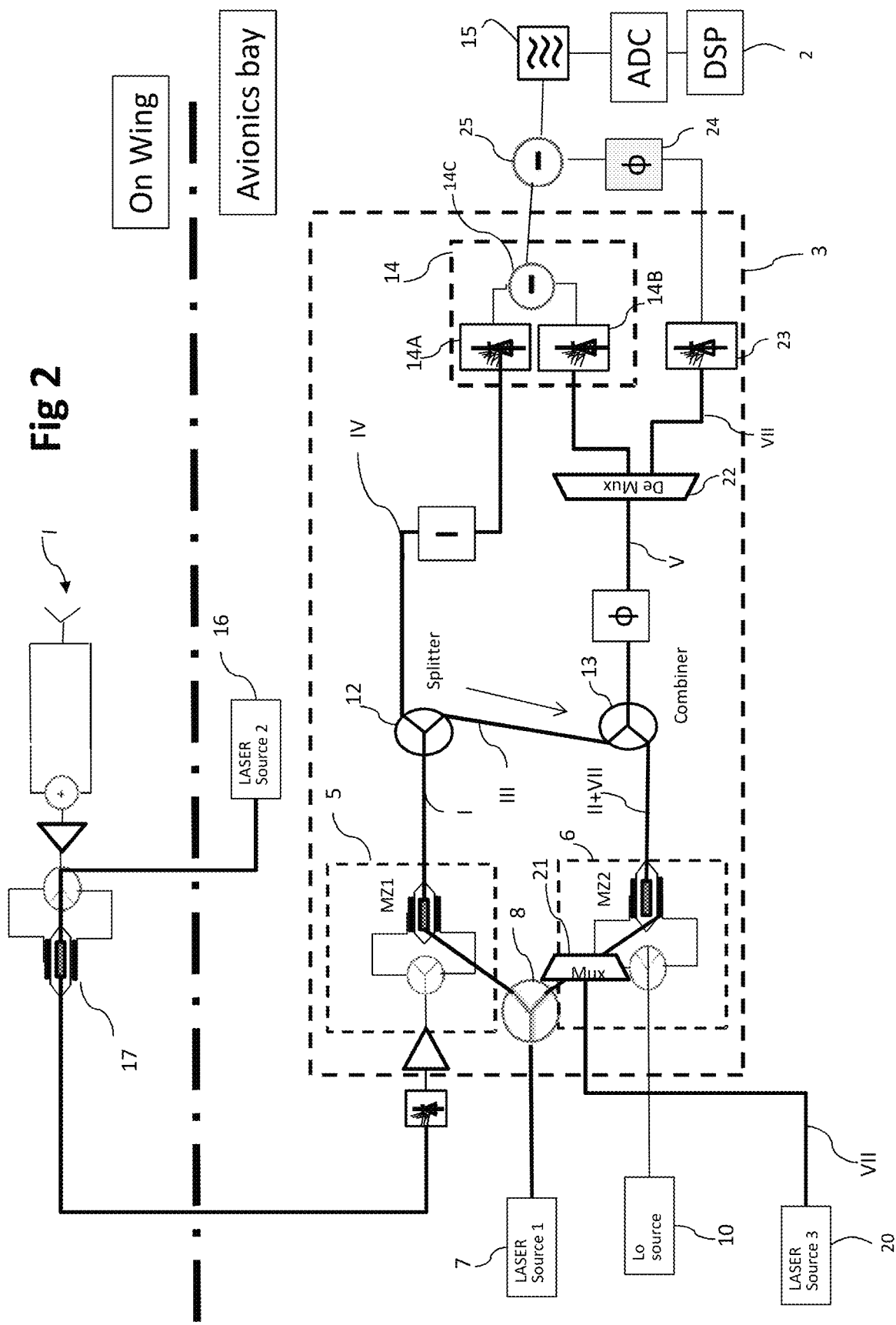

The invention will now be described by way of example with reference to the following figures in which:

FIG. 1 is a schematic of a Radio-on-Fibre link between an antenna and a digital processing system; and FIG. 2 is a schematic of a second embodiment of a Radio-on-Fibre link.

FIG. 1 shows a radio-on-fibre link between an antenna 1 and a digital signal processing system 2. The radio-on-fibre link includes a photonic RF mixer 3 used to down convert RF signals received through the antenna 1 in order that they can be digitised by an analogue to digital converter 4 before being processed by the digital signal processing system 2.

RF signals (e.g. microwave RF signals) received by the antenna 1 are passed to a first input 9 of the RF mixer 3.

The RF mixer 3 comprises a first Mach-Zehnder modulator 5 and a second Mach-Zehnder modulator 6. The Mach-Zehnder modulators 5, 6 are arranged to act in parallel. The two Mach Zehnder modulators 5, 6 may be formed on a single photonic monolith.

A first laser source 7 and beam splitter 8 provides light to the optical input of both Mach-Zehnder modulators 5,6.

The first Mach Zehnder modulator 5 is arranged to impose RF signals received at the first input 9 of the RF mixer 3 onto a first light beam (I). Also imposed are any beat frequencies (herein after RF-RF beat products) generated by interference between the received RF signals.

The second Mach Zehnder modulator 6 is arranged to impose a LO signal (typically of an RF frequency) from a Local Oscillator 10 received at a second input 11 of the RF mixer 3 onto a second light beam (II).

Depending on the bias condition of the first and second Mach Zehnder modulators 5, 6 the first and second light beams (I), (II) may carry a harmonic of the RF signal and LO signal respectively in addition to or instead of the RF signal and LO signal. For ease of reading, the description below refers to the RF signal and LO signal though it will be appreciated that it could be taken to mean the harmonic of these signals instead/as well.

Irrespective of the bias condition chosen, it is preferred that both the first and second Mach Zehnder modulators 5, 6 operate at the same bias condition.

The first light beam (I) carrying the RF signals is split by an optical splitter 12 to provide a third light beam (III) and fourth light beam (IV) each carrying the RF signal. The second beam (II) carrying the LO signal and the third beam (III) are combined by an optical combiner 13 to produced a combined fifth beam (V) that carries the RF signals, the RF-RF beat products, the LO signal and their mixed products including the beat frequencies between the LO and the RF signals and the beat frequencies between the LO and the RF-RF beat products.

The arrow in FIG. 1 alongside the representation of the third light beam (III) is indicative of the presence of an optical isolator to ensure light travels only in one direction between the optical splitter 12 and optical combiner 13.

It is preferable that the optical intensity of the second (II) and third (III) beams at the inputs to the combiner 13 are substantially same. This may be achieved by making splitters 8 and 12 unequal splitters, e.g. so that splitter 8 outputs the second beam (II) as optically weaker than the first beam (I), and that splitter 12 splits so that the third beam (III) is stronger than the fourth beam (IV). Alternatively, though less favourably, the optical strength of one or more of the beams may be controlled using a tunable attenuator. One or both of the first and second Mach Zehnders 5,6 may be used for this function or one or more separate optical components may be used.

Balanced photodetector circuitry 14 is arranged to receive separately and simultaneously, the fourth beam (IV) at a first optical input and the combined fifth beam (V) at a second optical input.

The balanced photodetector circuitry 14 comprises two photodiode detectors 14A 14B. The first photodiode detector 14A is arranged to receive the fourth beam IV and to output a first electrical signal representative of the RF signals and their mixed products carried on the fourth beam IV.

The second photodiode detector 14B is arranged to receive the combined fifth optical beam (V) and to output a second electrical signal representative of the RF signals their mixed products, the LO signal and the mixed products between LO signal and the RF signals and the mixed and beat frequencies including those derived from the LO.

The link may further include a variable attenuator to attenuate either the IV beam or combined (V) beam in order that the optical intensity of the two beams IV, (V) at the photodiodes 14A and 14B are similar.

The link may also include a phase controller to adjust the RF phase of the fourth beam IV and/or fifth beam (V) in order that the RF phases at the photodiodes 14A 14B are substantially the same.

The first and second photodiode detectors 14A 14B are arranged in balance such that their electrical outputs cancel. This may be implemented, for example, using a differential amplifier 14C or other common mode rejection arrangement. As such the signal at the electrical output of the balance photodiode circuitry 14 represents a difference between the signals carried on the IV beam and combined (V) beam.

Because the RF signals and RF-RF beat products are carried on both the fourth IV and fifth (V) beams, and thus form part of both first and second electrical signals, they cancel out to leave only the LO and beat products derived from the LO and received RF signals.

The removal of these mixed products is in addition to removal of noise derived from changes in amplitude of the laser source 1 over time, often referred to as relative intensity noise (RIN). Further, as an additional benefit, the arrangement also removes distortion products created by the first Mach Zehnder modulator, which will also be present in the fourth and fifth light beams (IV, V).

The output of the balanced photodetector 14 forms an analogue input to the ADC 4, which outputs an equivalent digital signal for receipt by the DSP 2.

The link may further include a low pass filter 15 before the ADC to eliminate high frequency signal components from the output of the balanced photodetector circuitry 14 that cannot be resolved by the ADC 4.

For various applications, including use on aerial platforms, it is preferred that the RF mixer 3 is remote from the antenna 1 so that it can be positioned where there is easier access to power, greater space and where environmental conditions are easier to control (protection from thermal variation, wind, rain etc.). In the present example the antenna 1 is illustrated to be on the wing, nose or tail, (or other part of the fuselage) of an aerial platform and the RF mixer 3, ADC 4 and DPS 2 are located remote to the antenna 1, within an avionics bay of the aerial platform.

The RF signal from the antenna 1 may be carried by an electrical connector, e.g. co-axial lead, from the antenna 1 to the mixer 3. However, because this is lossy it is preferred that the RF signals from the antenna 1 are carried to the RF mixer 3 via a further optical link which is favourably an optically linear link.

The further optical link includes a second laser 16, which is favourably also located remote from the antenna 1—favourably held in the avionics bay—and a further Mach-Zehnder modulator 17 located proximate to the antenna 1 arranged to impose the RF signal from the antenna 1 onto a sixth beam (VI) outputted from the laser 16 and carried to the modulator 17 via optical fibre. The sixth beam (VI), following being outputted from the modulator 17, is carried via fibre to a location proximate the RF mixer 3, e.g. into the avionics bay, where it is received by a photodetector 18 that provides an electrical signal output corresponding to the RF signal imposed on the sixth beam (VI). The electrical output from the photodetector 18 is received at the first input 9 of the RF mixer 3.

It will be appreciated that this arrangement can be used where it is wished to place the antenna 1 remotely from the processing system 2. An obvious application is the conveying of telecommunication signals from an antenna proximate the top of a cellular network mast to a cabinet, bay or the like proximate the base of the mast.

Although the invention is described implemented as an optical down converter, the invention can be equally applied as an up converter. For example, the link may be used between a transmitter and an antenna to up convert two input signals, e.g. generated by the transmitter system for transmission from the antenna at a desired microwave frequency, the invention acting to suppress any beat products formed by the two input signals.

FIG. 2 describes a variant link adapted to remove products removed by the arrangement of FIG. 1 and in addition the LO signal and distortion products of the second Mach Zehnder modulator 6.

The second embodiment additionally includes a further laser source 20 that outputs a seventh beam (VII) having a wavelength that differs from the wavelength of the beam from the first laser 7 and thus also of the wavelength of first and second beams I and (II). Favourably the wavelength separation between the first beam I and seventh beam (VII) is at least 2 nm in order to avoid optical beating at a frequency that could be recognised by the photodiode sensors 14A 14B.

The seventh beam (VII) is multiplexed with the second beam (II) through a MUX combiner 21, and the outputted combined seventh and second (VII), (II) beams forms the optical input of the second MZ modulator 6. The second MZ modulator 6 imposes the LO signal on both the (VII) and (II) beams, which are then combined with the (III) beam by combiner 13 to provide an output comprising the combined second, third and seventh (II), (III) and (VII) beams. The seventh (VII) beam does not interact with the (II) and (III) beams. The seventh (VII) beam is separated from the (II) and (III) beams by an wavelength sensitive splitter (De MUX) 22, the separated seventh beam (VII) received by a further photodetector 23 which outputs an electrical signal equivalent to the LO signal imposed on the seventh beam (VII). The phase of the output from the photodetector 23 is adjusted by phase controller 24 and fed to a first input of a differential amplifier 25 (or circuitry with equivalent function) which also receives, at a second input, the output from the balanced photodetector circuitry 14. The differential amplifier 25 outputs a signal corresponding to the difference between the signals received at its two inputs. The phase controller 24 can be used to ensure that phases of the LO signal arriving at both inputs of the differential amplifier 25 are the same.

It is preferred that all components of the RF mixer 3, bar the balanced photodiode detector circuitry 14, are formed as a single integrated optical circuit, i.e. on a single optical monolithic material (chip) with the balanced photodiode circuitry flip chipped onto the monolith. However, it is possible to provide the RF mixer functions from two or more discrete optical components, or as a hybrid thereof.

The invention claimed is:

1. A radio frequency (RF) mixer, comprising:
 a first photonic modulator configured to impose RF signals received through an input of the RF mixer onto a first optical beam;

a second photonic modulator configured to impose a LO signal from a LO signal source onto a second optical beam;
an optical splitter configured to split the first optical beam outputted from the first photonic modulator to provide a third optical beam and a fourth optical beam;
an optical combiner configured to combine the third optical beam with the second optical beam;
a balanced photodetector circuit configured to provide an electrical signal output corresponding to a difference between electrical responses of:
a first photodetector configured to receive the combined third optical beam and second optical beam, and
a second photodetector configured to receive the fourth optical beam.

2. A RF mixer according to claim 1, wherein the first photonic modulator comprises:
a first Mach-Zehnder modulator; and the second photonic modulator comprises:
a second Mach-Zehnder modulator.

3. A RF mixer according to claim 1, wherein the input of the RF mixer is arranged to receive RF signals from an antenna.

4. A RF mixer according to claim 1, wherein an output of the RF mixer provides an input to an ADC.

5. A RF mixer according to claim 1, wherein the RF mixer is configured to function as a down converter.

6. A RF mixer according to claim 1, comprising:
a first light source that emits light with a first wavelength; and
a further optical splitter configured to split light from the first light source to provide the first and second optical beams.

7. A RF mixer according to claim 6, comprising:
a second light source that provides a subsidiary optical beam of a second wavelength that is different relative to the first wavelength; and
a multiplexer that multiplexes the second optical beam with the subsidiary optical beam; wherein:
the second photonic modulator is configured to impose the LO signal from a LO signal source onto the multiplexed second optical beam and subsidiary beam; and
the multiplexed second optical beam and subsidiary beam are combined with the third optical beam;
a demultiplexer is configured to separate, before reaching the first photodetector, the subsidiary optical beam from the combined third optical beam and second optical beam;
a third photo detector is configured to receive the separated subsidiary optical beam and to output in response the LO signal that was imposed thereon by the second optical modulator; and
subtractor circuitry configured to receive the electrical signal output from the first photo detector and the electrical signal output of the balanced photodetector, and to provide at an output of the subtractor circuitry, an electrical signal corresponding to a difference therebetween.

8. A RF mixer according to claim 1, comprising:
one or more intensity controllers configured to alter the intensity of one or more of the first, second, third and fourth optical beams, in order to substantially match an optical intensity of the combined second and third beam, and fourth beam at the first and/or second photodetector.

9. A radio on fiber link comprising:
a fiber link; and
the RF mixer of claim 1.

10. A radio on fiber link according to claim 9, configured to transmit an RF signal from an antenna to an ADC, the RF mixer being remote from the antenna, wherein the link comprises:
a further photonic modulator configured to impose the RF signals from the antenna onto a further optical beam; and
a fiber that extends substantially between the antenna and RF mixer along which the further optical beam with imposed RF signals is carried; and
a further photodetector configured to receive the further optical beam and output an electrical signal corresponding to the RF signal imposed on the further optical beam, the output of the further photodetector being connected to the input of the RF mixer.

11. A radio on fiber link according to claim 10, wherein the RF mixer is sited in combination with:
an avionics bay of an aerial platform.

12. A method of mixing radio frequencies for up converting or down converting, the method comprising:
using a first photonic modulator to impose RF signals received through an input of an RF mixer onto a first optical beam;
using a second photonic modulator to impose a LO signal from a LO signal source onto a second optical beam;
splitting the first optical beam outputted from the first photonic modulator to provide a third optical beam and a fourth optical beam;
combining the third optical beam with the second optical beam;
using a balanced photodetector circuit to provide an electrical signal output corresponding to a difference between electrical responses of:
a first photodetector configured to receive the combined third optical beam and second optical beam, and
a second photo detector configured to receive the fourth optical beam.

13. A method according to claim 12, comprising:
splitting an optical output from a first light source that emits light with a first wavelength to provide the first and second optical beams.

14. A method according to claim 13, comprising:
multiplexing the second optical beam with a subsidiary optical beam having a wavelength that is different from the second optical beam;
imposing the LO signal onto the multiplexed second optical beam and subsidiary beam;
combining the multiplexed second optical beam and subsidiary beam with the third optical beam;
separating the subsidiary optical beam from the combined third optical beam and second optical beam before it reaches the first photodetector;
using a third photo detector configured to receive the separated subsidiary optical beam to output the LO signal that was imposed thereon; and
using subtractor circuitry configured to receive the electrical signal output from the first photo detector and the electrical signal output of the balanced photodetector to provide at an output of the subtractor circuitry, an electrical signal corresponding to the difference therebetween.

15. A method of transmitting a RF signal between an antenna to an ADC by mixing radio signals according to claim 12, wherein transmitting RF signals between the antenna and RF mixer comprises:

imposing the RF signals onto a further optical beam with a further photonic modulator;

transmitting the further optical beam on which the RF signals have been imposed over a fiber that extends substantially between the antenna and RF mixer; and using a further photodetector configured to receive the further optical beam subsequent at a output of the fiber to provide an electrical signal corresponding to the RF signal imposed on the further optical beam.

16. A RF mixer according to claim 2, wherein the input of the RF mixer is configured to receive RF signals from an antenna.

17. A RF mixer according to claim 16, wherein an output of the RF mixer provides an input to an ADC.

18. A RF mixer according to claim 17, wherein the RF mixer is configured to function as a down converter.

19. A RF mixer according to claim 18, comprising:
a first light source that emits light with a first wavelength; and
a further optical splitter configured to split light from the first light source to provide the first and second optical beams.

20. A radio on fiber link comprising:
a fiber link; and
the RF mixer of claim 9.

* * * * *

UNITED STATES PATENT AND TRADEMARK OFFICE
CERTIFICATE OF CORRECTION

| | |
|---|---|
| PATENT NO. | : 11,496,219 B2 |
| APPLICATION NO. | : 17/423232 |
| DATED | : November 8, 2022 |
| INVENTOR(S) | : Ian Flint et al. |

It is certified that error appears in the above-identified patent and that said Letters Patent is hereby corrected as shown below:

On the Title Page

Item [73] change:
"ELONARDO UK LTD;"
To:
-- LEONARDO UK LTD --.

Signed and Sealed this
Third Day of January, 2023

Katherine Kelly Vidal
*Director of the United States Patent and Trademark Office*